United States Patent [19]
Cahen et al.

[11] Patent Number: 5,413,942
[45] Date of Patent: May 9, 1995

[54] MONOLITHIC ELECTRONIC STRUCTURES

[75] Inventors: David Cahen; Abram Jakubowicz; Geula Dagan; Konstantin Gartsman, all of Rehovot, Israel

[73] Assignee: Yeda Research and Development Co. Ltd., Rehovot, Israel

[21] Appl. No.: 899,548

[22] Filed: Jun. 16, 1992

Related U.S. Application Data

[63] Continuation-in-part of Ser. No. 489,816, Mar. 9, 1990, abandoned.

[30] Foreign Application Priority Data

Mar. 14, 1989 [IL] Israel .................................... 089617

[51] Int. Cl.$^6$ ........................................... H01L 21/26
[52] U.S. Cl. ........................................ 437/16; 437/14; 437/15; 437/170; 437/957
[58] Field of Search .................. 437/16, 15, 14, 136, 437/171, 170, 172, 173, 957

[56] References Cited

U.S. PATENT DOCUMENTS 2,924,003  2/1960  Sim .................................... 633/172

OTHER PUBLICATIONS

Soltz et al. Ionic Mobility and Electronic Function Movement in $C_uInSe_2$ *Solid State Ionics* Sep. 1988, pp. 1105–1110.

Primary Examiner—Brian E. Hearn
Assistant Examiner—Kevin M. Picaroat
Attorney, Agent, or Firm—Keck, Mahin & Cate

[57] ABSTRACT

The invention relates to a monolithic two- or three-dimensional multi-element electronic structure made of a ternary or multinary chalogenide and pnictide semiconductor. The invention further relates to a method for the production of monolithic electronic single- or multi-element structures from semionic materials, which comprises applying at about ambient temperatures or below, a predetermined electric field, localized to specific locations of said structure, if desired with an additional excitation field thus creating the desired electronic device elements throughout the semionic material at predetermined locations thereof.

19 Claims, 8 Drawing Sheets

MONOLITHIC ELECTRONIC STRUCTURES

This application is a continuation-in-part of application Ser. No. 07/489,816, filed Mar. 9, 1990 entitled Monolithic Electronic Structure, now abandoned.

FIELD OF THE INVENTION

The invention relates to methods and apparatus that utilize an electric field, preferably in combination with a thermal and/or electromagnetic field, to create semiconductor devices in a semionic material, without the need for an external dopant source, at room temperature or below, and to devices and articles created thereby.

According to the invention, current flow, as a result of the application of the electric field, is limited in magnitude and time, so as to prevent macroscopic melting of either the semionic material or of the material(s) used to make electrical contact to it. In addition, the electric field is chosen so as not to lead to macroscopic decomposition of the semionic material.

According to the invention a pre-determined electric field, with or without a pre-determined thermal profile, induces/creates single or multiple device elements in a semionic material. This material can be originally homogeneous and uniform with or without the presence of extraneous constituents. The process allows fabrication of a monolithic structure, containing a plurality of different or identical types of electric device elements distributed in two or three dimensions in the semionic material.

The invention relates to a novel process and apparatus for the production of semiconductor or semiconductor-containing devices for electronic and optical applications, without the need for thermal in-diffusion of external dopants and without the need for an external dopant source, even with a semiconductor material which may be homogeneous initially. More specifically, the invention relates to the use of an electric field to control the distribution of dopants in a semiconducting material, whose electronic properties are controlled by said dopants, at least one of which has sufficiently high mobility, so as to allow its direction of motion to be controlled by said field in a temperature region where said material's electrical behavior is extrinsic. Alternatively, one or more of the dopants can be created or annihilated by such field in such temperature region. This is feasible due to what is believed to be electromigration, driven by a direct, electrostatic force and/or by way of drag(wind) forces, e.g. electron wind.

BACKGROUND OF THE INVENTION

Basic building blocks of semiconductor devices are the junction, essentially a narrow region where the doping level and nature of dopants changes abruptly, and a conductor, used to lead electronic carriers to and from the junction or more complicated elements, comprising one or more junctions. Commonly junctions are fabricated by high temperature thermal diffusion of a dopant from an external source or by direct ion implantation of the dopant. This is so because of the need to reach conditions under which the dopants can move in the semiconductor, so that they can attain the necessary non-equilibrium distribution. At the temperature, where thermal diffusion is commonly carried out, a semiconductor with a doping density that is within the range, normally employed for electronic devices, behaves intrinsically. This means that it has a higher concentration of so called "intrinsic" free charge carriers (these are carriers that are generated by band-to-band transitions) than of carriers generated by dopants. This reduces the possibility to use electrical influence to guide the dopants, due to electrical screening. At lower temperatures, where such use could be beneficial, the dopants have too low a diffusity. Ion implantation leads generally to damage in the region that has been implanted, leading to undesirable electrical properties that are removed by subsequent thermal anneal.

Both methods need an external source, and a surface through which the doping species are introduced into the material, which limits the dimensionality of devices that can be produced in this manner (cf. Handbook on Semiconductors, T. S. Moss ed., vol. 3 "Materials, Properties and Preparation", S. P. Keller, volume ed {North-Holland, Amsterdam, 1980}).

The effects of electric fields on influencing the motion of external dopants in simple, elemental semiconductors have been described for the cases of Li, Cu, Ag or Au in Ge or Si at elevated temperatures (C. S. Fuller and J. C. Severiens, Phys. Rev. 92 (1953) 1322; 94 (1954) 21; C. J. Gallagher, J. Phys. Chem. Solids 3 (1957) 82; see also B. I. Boltaks, "Diffusion in Semiconductors", Acad. Press N.Y. 1963). Thus, a p/n junction, that had been created previously by thermal diffusion of Li or Cu in Si, could be moved laterally, by applying an electric field of 1–10 V at temperatures of ca. 400° C. (Li in Si) or 800° C. (Cu in Ge). It was also found that at temperatures below 600° C. the field did not anymore influence the motion of Cu in Ge, for example. The facility by which Li can move in Si is today exploited for the manufacture of X-ray detectors. For modern electronic devices Cu, Li, and the like are undesirable as dopants in Si, for example, as they lead to deterioration of the required electronic properties. An exception is their use in photoconductive devices, which often have a homogeneous distribution of the dopant, and as lifetime killers in transistors to improve switching times. An idea similar to the one employed in the prior art described above, was proposed by Weppner (Ger. Offen. DE 3,503,264 and 3,546,437) and shown to be valid for $TiO_2+O_2$. In general it was proposed to deposit a material onto a semiconductor and then use an electric field to move this material into the semiconductor. The proposed uses of this method, except for the case of $TiO_2$, appear to be problematic in terms of reduction to practice. In the case of $TiO_2$ (described also in J. Solid State Chem. 21 (1977) 305 and Solid State Ionics 18/19 (1986) 873) the freezing in of a smooth linear doping profile, created at high temperature (700° C.) by applying an electric or chemical potential gradient is suggested to create p and n regions.

Freezing in had to be used here as in classical doping by thermal in-diffusion, since otherwise the compositional gradients that are created will not be stable. Indeed stability is one of the more problematic aspects of using an electric field for doping. This problem can be overcome by the present invention by using high field strengths, since then new, non-equilibrium mechanisms, that change the dopant density, can be activated. The situation can be compared to that of thermal in-diffusion of dopants, where a non-equilibrium state, obtained at high temperature, is frozen in, giving a doping profile that is stable under temperatures where the device works. In contradistinction, the present invention creates a non-equilibrium profile with a strong electric field which is stable at the lower fields used during operation of the device.

Semionics, the types of materials that the invention relates to, have been studied, in terms of their basic properties. One of them, CuInSe$_2$, is being developed in thin film polycrystalline form, for use in a photovoltaic device. The occurrence of ionic conductivity in a number of semionics, was disclosed in U.S. Pat. No. 4,115,633. The materials were of the type ABX$_2$ and AB$_5$X$_8$ where A=Cu,Ag; B=In,Ga; X=S,Se. In later work, it was shown that a high electric field, applied to an In/CuInTe$_2$/In structure can cause a change from a low to a high conductivity state. Because of the very high current that flows, thermal effects probably played a dominant role (I. V. Bodnar et al., Neorg. Mater. 20, (1984) 1810). R. J. Matson et al. (Appl. Phys. Lett. 50, (1987) 158) showed that CdS deposition onto CuInSe$_2$ can lead to partial conversion of the CuInSe$_2$, from p to n-type. In previous studies of semionics (D. Soltz, M. Sc. Thesis, Feinberg Graduate School, the Weizmann Institute of Science, (1987); D. Soltz et al., Solid State Ionics, 28-30 (1988) 1105) normal or classical thermal diffusion (e.g. of Cu) was found to lead to type conversion in CuInSe$_2$.

In these studies the effective diffusion coefficient of Cu was measured in CuInSe$_2$, in separate experiments, using a well-known point contact method, without using an external phase. However, attempts to obtain type conversion by this method were not successful, since they led to thermal breakdown of part of the material, due to run-away current flow. The only electric field effects noted in these studies were those obtained close to equilibrium, leading to the smeared-out gradual compositional gradients created during measurement of the diffusion coefficient.

Another type of semionic is (Hg,Cd)Te, a material that is also of interest for its infra-red detection properties. In addition, there are various other semiconducting materials, such as, Cu or Li doped ones, e.g. CdS:Cu; ZnSe:Li and GaAs:Cu(:Si), that are mostly of interest for optical or opto-electronic applications (photoconductivity, optical switching, light emission) that show semionic behavior. Some analogues of CuInSe$_2$ (e.g. AgGaSe$_2$, ZnGeP$_2$) are furthermore of interest for non-linear optical applications.

SUMMARY OF THE INVENTION

It is a general object of the present invention to provide a novel process and apparatus, generally applicable to semionic materials, to circumvent the problem of resorting to an external source as dopant to create suitable novel electronic device structures. It is a further object of the invention to provide a process for this purpose that can be used at room temperature and even below. It is a further object of the invention to create such structures in an externally controllable fashion by applying an electric field alone or in conjunction with an additional excitation field, such as a thermal or electromagnetic one.

The invention relates to monolithic electronic structures, made from semionic materials, said materials satisfying the following criteria:

they are semiconductors, which contain at least one component (this includes e.g. Li in ZnSe:Li) or component-related native defect that has sufficient diffusity, so that it can be rendered mobile at temperatures, well removed from those where the material becomes intrinsic ($E_G/kT \geq 20$; $E_G$: optical band gap of the material), under the influence of an electric field that is insufficient to lead to decomposition of the material.

While, normally, application of high electric fields to a conductive material, leads to run-away heating, thus facilitating thermal diffusion processes or even decomposition, one preferred embodiment of the invention relates to the use of AC or pulsed fields to overcome this problem. In another preferred embodiment the material is actively cooled, during the application of the electric field or of the electric and electromagnetic or particle beam-induced field.

The material retains its semiconducting character, also when small (up to about 5 atom percent) deviations from the ideal stoichiometry occur or are induced. This may occur also over limited spatial regions.

The material provides the necessary dopants, without the need of adding external material for this.

The material can provide the necessary dopants itself, by the presence or creation of native defects, such as vacancies, interstitials and/or anti-site defects.

At low electric fields, to which devices are normally exposed, the dopant distribution that has been created at high electric field strength, used during its creation, is stable.

At low electric fields, to which devices are normally exposed, the components that are mobile at high fields, do not move.

The net ionized donor or acceptor (i.e. ionized dopant) density in the material is above the carrier density provided by intrinsically created carriers, but below the density that would constitute degenerate electrical behavior. The preferred range of the net ionized donor or acceptor density is from a factor of 10 to about $10^5$ above the density provided by intrinsically created carriers. The semionic materials that the invention relates to are those of the generic groups I-III-VI$_2$ and II-IV-V$_2$ and (IIa,IIb)-VI, as well as to II-VI, III-V compounds, doped with a dopant such as Cu, Li, and Zn. Specifically the invention relates to the semionics where I=Cu and/or Ag; II, IIa and IIb=Cd, Hg or Zn; III=In and/or Ga and/or Al and/or Tl and/or Fe; V=P and/or As and/or Sb, and/or V (vanadium); VI=S and/or Se and/or Te. Thus this includes compounds such as CuInSe$_2$ and (Cd,Hg)Te. Also (Ia,Ib)-III-IV$_2$, I-(IIIa, IIIb)-VI$_2$, (IIa,IIb)-IV-V$_2$ etc. are included. In its simplest form the invention concerns applying an intermittent electric field to the semionic material. The field should be of sufficient strength to change the dopant concentration and create doping profiles, sufficiently sharp to result in device structures, such as homojunctions (p/n junctions), bipolar transistors (p/n/p or n/p/n structures) and the like, on a local scale, said scale being limited at its upper end only by the field strength that can be applied (it has to be sufficient but not to lead to decomposition, either directly, or via the current flow, induced by it) and, at its lower end, also by the spatial delineation of the electric field governed e.g. by the size of the contact.

In a preferred embodiment of the invention, a thermal field, e.g. a thermal gradient, or a standing wave profile, is applied to the semionic, to provide further control over the motion of the dopant that migrates under the influence of the electric field. Such thermal wave pattern can be induced by localized heat sources, by actively cooling part of the material, by means of spatially varying absorption of light with energy $h\nu > E_G$, or by a particle beam, e.g. an electron beam, depending on the spatial scale desired. This embodiment relies on the temperature dependence of the electrical conductivity of the semionic material. Often larger effects can be achieved by relying on the photoconductivity or electron-beam induced conductivity of the material. Thus in one embodiment, an optical interference pattern is created onto and in the semionic causing the occurrence of illuminated regions with higher conductivity and darker regions with lower conductivity. The electric field will now act differently on the regions that are illuminated, than on those that are not illuminated. It can be advantageous at times, to synchronize the electrical field with the additional field. This provides a new way to use the invention for the fabrication of a doping superlattice.

The invention is illustrated by way of example with reference to the schematical drawings, not according to scale.

BRIEF DESCRIPTION OF THE DRAWINGS

(FIGS. 3B and 4B).

PREFERRED EMBODIMENTS

These will be described with the aid of the FIGURES.

Figure 1A:
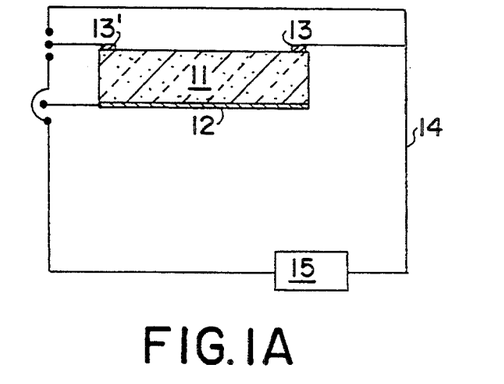
FIGS. 1A and 1B are a sectional side view and a perspective view of an experimental set-up for the application of an external electric field to a semionic sample.
Figure 1B:
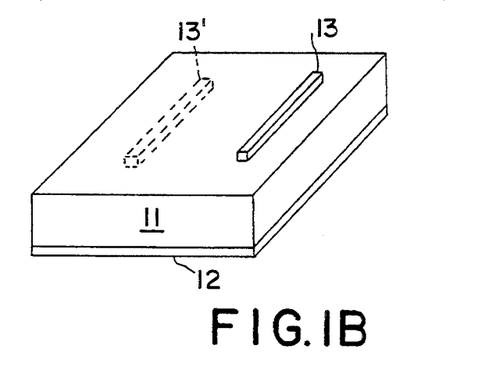

In FIG. 1 a preferred embodiment is shown to create a p/n junction in an originally homogeneous semiconductor (11), by applying a voltage between contacts 12 and 13 (which can be ohmic or non-ohmic), using power supply 15, via leads 14. The junction will be created around contact 13, its exact location depending on the duration and magnitude of the applied voltage and the original electronic properties of 11. Junction creation (and propagation) will become particularly pronounced when the system is brought into a condition of reversible breakdown, i.e. without causing damage to the semiconductor (e.g. by uncontrolled thermal instability). If desired, a multiple structure can be created by using two top contacts 13 and 13' or the voltage can be applied between 13 and 13' only. It is also possible to use one continuous top contact 13. FIG. 1A (top) is a top view, while FIG. 1B (bottom) is a perspective view.

Figure 2:
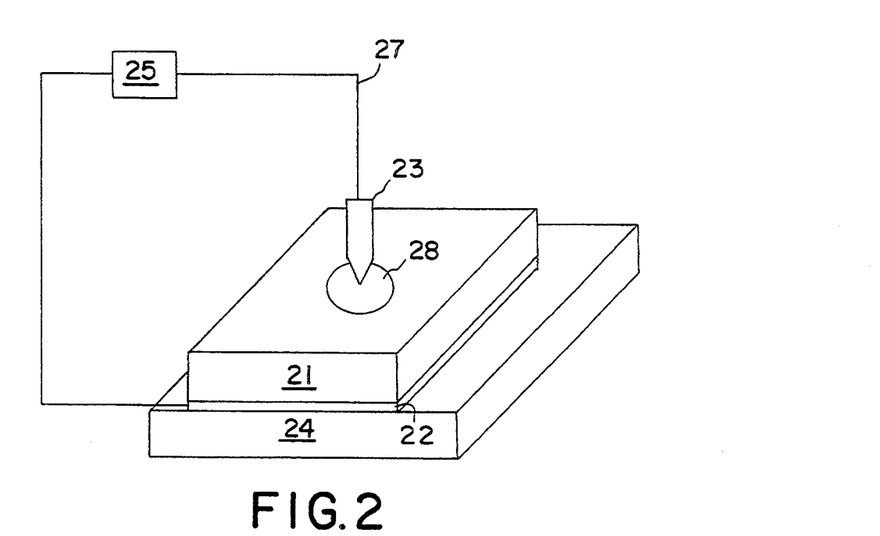
FIG. 2 is a perspective view of an experimental set-up for the use of a point contact to create a hemispherical junction.

As shown in FIG. 2, a voltage is applied, by source 25, via point contact 23 and large area contact 22 to semiconductor 21, via leads 27. Semiconductor 21 is mounted on substrate 24. As a result a hemispherical junction is created between type-converted region 26 and the remainder of semiconductor 21.

When an electrical potential difference, $\Delta\phi$, is imposed across a mixed conductor, decomposition (formation of a stable second phase) can occur when $\Delta\phi > 'Eo$, the minimum decomposition potential. Processes, that do not lead to chemical decomposition, can occur when $|\Delta\phi| < |'E|$, where $'E$ is the actual decomposition potential. While for a semionic material one is particularly interested in the latter ones, it is instructive first to consider briefly decomposition processes. One notes that, solid state electrochemically, one is considering a cell with two ionically blocking, electronically conducting electrodes. Since, in this case the constituent's chemical potentials, $\mu$, are undefined, effects of applying a voltage across a sample depend on its defect chemistry.

Decomposition processes can be described by considering the point electrode configuration, shown schematically in FIG. 2. Application of $|\Delta\phi| > |'E,|$ with the point electrode configuration, can result in one of two irreversible decomposition reactions, depending on the polarity of the point electrode (signs of $\Delta\phi$ are with respect to the point or small area electrode).

Oxidative decomposition occurs when a strong positive bias, $+\Delta\phi$, is applied to the point electrode ($\Delta\phi > 'E+$), ionic current can flow towards the large area, counter electrode. At sufficiently high voltages, oxidative decomposition can take place on the point electrode.

Reductive decomposition occurs when precipitation of the mobile metal (A) takes place on the semiconductor surface near the point electrode ($-\Delta\phi < 'E-$), when a strong negative bias, $-\Delta\phi_A$ is applied to the point contact. This can occur as the result of electromigration of point defects to the surface and their subsequent neutralization. The result will be to leave a phase, which, all other factors being equal, should be more n- or less p-type, around the point electrode, than the original material.

The process starts when the difference in electrochemical potential of the A ion ($\Delta\mu_A^+$) across the sample, is positive; $\Delta\mu_A^+ = \Delta\bar{\mu}_A + F\Delta\phi$, where $\mu_A$ is the chemical potential of A and $\Delta\mu_A = F'Eo$. For an ideal reversible process, this will be the case when $$\Delta\mu_A^+ = F(\Delta\phi - 'Eo) > 0 \tag{1}$$

In the set-up of FIG. 2 the actual $'E$ values are much higher than $'Eo$ ones (several volts, at room temperature, for 1–2 mm thick samples) and depend on the bulk and surface quality of the materials. This is the case of supersaturation. Materials with better crystalline quality will have higher overpotentials ($'E - 'Eo$) for the decomposition reactions and thus, processes, that do not lead to decomposition, will be more likely in them. By including the overpotential eqn. 1 becomes $$\Delta \bar{\mu}_A{}^+ + F(\Delta\phi - 'E) > 0 \qquad (2)$$

$\Delta \bar{\mu}_A{}^+$ depends, via $\Delta\mu_A$, on the duration of the experiment. If a point electrode is used, then decomposition is readily detected by a rapid increase in current, caused by an increase in effective area of the point electrode.

Processes, below the decomposition potential ($|\Delta\phi| < |'E|$) can occur in addition to, or instead of decomposition reactions, mainly as a result of A ionic mobility, when $|\Delta\phi| > |'E_A{}^{min}|$, where $'E_A{}^{min}$ is the minimum potential needed for A ion migration. In mixed conductors with structural disorder, such as Ag$_2$S, $\mu_A{}^+$ is taken as constant across the sample, in the absence of an external potential. For a semionic material, such as CuInSe$_2$, this is not necessarily so since, while the high chemical diffusion coefficient, $\bar{D}$, of Ag$^+$, even in $\alpha$-Ag$_2$S leads to fast relaxation (seconds), $\bar{D}$(Cu$^+$) in CuInSe$_2$ is much smaller. This means that, once the external driving force for migration is removed, the Cu ions that drifted can become trapped quickly.

In the simplest small current case ("classical" migration), the A ion starts to migrate towards a negatively polarized point electrode when $$F\Delta\phi - \Delta\bar{\mu}_A{}^+ > FE^{min} \qquad (3)$$

This leads to an increase in $\mu_A{}^+$, which results in changes in composition in a small volume near the point contact. This process is driven by a Coulomb force, $F_d$, given by $$i\ F_d = Z_d \cdot q \cdot E \qquad (4)$$

where $Z_d$ is the (effective) valence of the migrating defect, q the electronic charge and E is the electric field. Since the migrating species is a dopant, changing its concentration leads to changes in $N_a/N_d$ (ionized acceptor/donor density), close to the point electrode, and thus to changes in the net electronic carrier concentration, $n_e$, which will be expressed in the electronic conductivity, $\sigma_e (\propto n_e)$. Steady-state conditions are obtained when inequality (3) is not anymore valid and $$F\Delta\phi - \Delta\bar{\mu}_A{}^+ \approx FE_A{}^{min} \qquad (5)$$

As long as no type conversion occurs this process forms the basis for the determination of $\bar{D}$ from the decay of the current, at constant voltage, that flows between the point and counter electrode.

Indeed, one can observe, at room temperature, the above described behavior, typical of a mixed electronic and ionic semiconductor. For instance, in a p-type sample $\sigma_e$ will decrease, after prolonged negatively biasing of the point electrode (up to several volts, depending on the sample). This can be explained by an increase in $N_d$, and/or a decrease in $N_a$, at the cathode (point electrode). This will result in a higher compensation state of the p-type material close to this electrode, which will decrease $\sigma_e$. Such behavior leads to a smoothly varying dopant gradient.

The high current at high field case, i.e., that of a semiconductor responding to an external field similar to a classical mixed, ionic and electronic conductor, changes with increasing field strength, if, in addition, high current density passes (of the order of A/cm$^2$) or more. The high currents result from reversible electrical ("soft") breakdown, i.e. breakdown that does not lead to decomposition. Then an additional mechanism of electromigration can be considered, viz electron (or hole) "wind", i.e. "dragging" of charged defects by the electronic charge carriers (cf. the concept of enhancement factor in solid state ionics). The effect arises from the scattering of electronic charge carriers by the defect under consideration and can be viewed classically as transfer of momentum from electronic carriers to mobile defects. The force exerted by the electron wind, $F_w$, is given by $$F_w = -n_e \cdot \lambda_e \cdot S_e \cdot q \cdot E \qquad (6)$$

where $\lambda_e$ is the mean free path between scattering events and $S_e$ the cross section for electron-ionized impurity scattering. From eqns. 4 and 6 one sees that the wind effect will dominate only if $(n_e \cdot \lambda_e \cdot S_e) > Z_d$. In metals, the wind effect is possible due to the high (carrier and) current density. The low carrier concentration in the subject semionic materials used in the present invention, which are at times highly resistive, does not favor the wind effect. While, for geometric reasons, the point electrode geometry increases the current density in the electrode region, there are also other factors which control the wind effect. In a semiconductor the charged defect's scattering cross-section, $S_e$, is much higher than in metals, due to weaker screening. As a result strong local fields can exist, up to a limiting current density, where screening effects will start to play a role again.

Under strong reverse bias current can flow by way of impact ionization. In such case the carriers are hot and their relaxation, via phonons, will lead to highly localized temperature increases, $\Delta T$. Under these conditions thermal spikes can occur, via short-lived large energy fluctuations. Then defect reactions, such as creation/annihilation of defects and/or their complexes can take place. Also ionization of atoms in an electric field, recharging effects, impact ionization, and the energy released in electron-hole recombination processes are important factors in generating new defects and their complexes. Changes in defect formation energies, as a result of changes in Fermi level, can play a role in compensation phenomena. In terms of diffusion, defect recharging effects can facilitate diffusion from a different charge state of the defect. Since $\bar{D}$ depends exponentially on temperature, the above-mentioned increase in local temperature can facilitate electromigration in the junction region, which is the region where $\Delta T$ will be largest, i.e. the local temperature of that region can be well above that of the ambient. This means that $\bar{D}$ can be much higher inside than outside this region. This will be true only as long as this region is sufficiently depleted of carriers, so that screening effects do not outweigh the increase in $\bar{D}$. This affects especially $F_d$, since $F_w$ not only decreases when E decreases, due to screening by excess carriers, but also increases with carrier density.

Figure 2A:
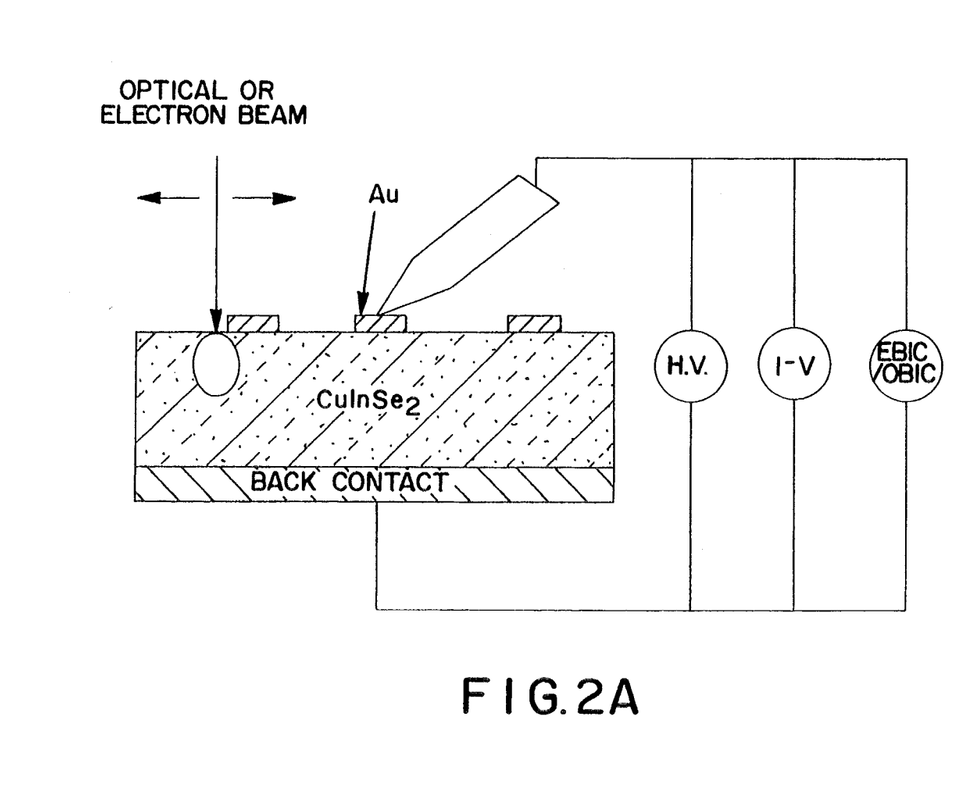
FIG. 2A is a sectional side view of the experimental set-up of FIG. 2.
Figure 2B:
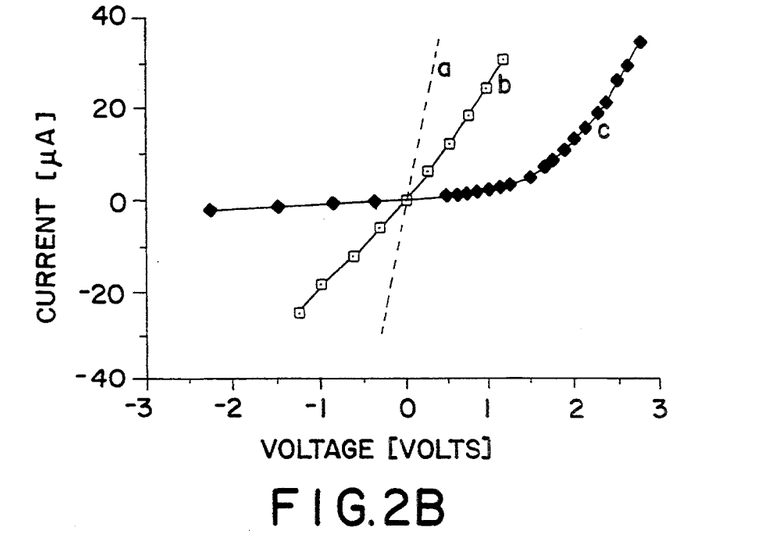
FIGS. 2B–F are current-voltage-power graphs showing aspects of the operation of set-up shown in FIGS. 2 and 2A and the results.

The effects of applied electric field, and resulting current flow, can be conveniently monitored in several ways (FIG. 2A). By scanning an electron or optical beam across the relevant (treated) area of the sample, one can use electron- or optically-induced current flow (EBIC or OBIC) to map the changes, as they occur, in the way that they show up at the surface. FIG. 2A shows this in a schematic fashion. H.V. stands for high voltage. It shows two of the ways to achieve high level fields viz. use of an inert point contact (e.g. Au or Pt or W) and a small dot, of inert conducting material, deposited on the surface. The size of the point contact or dot can be increased for as long as the resulting electric field is sufficient to change the dopant concentration. It can be decreased down to nm size. The contact does not need to be in direct touch with the semionic and field-emission effects can be utilized, as well to establish the electric field inside the semionic, while still allowing for current flow. Other methods to monitor the effects of the electric field are voltage contrast (using a scanning electron beam) and, current-voltage curves (I–V). This latter possibility is illustrated in FIG. 2B. This shows the I–V curves obtained from an original ohmic contact made to an originally homogeneous sample of n-CuInSe$_2$ (a), which was subsequently biased with the point contact as anode (b) and as cathode (c) at room temperature. The applied voltages and currents were adjusted during the process (cf. FIG. 2C), up to several volts and several $\mu$A's for several minutes. EBIC shows that the changes, in the case of a 10–50 $\mu$m diameter contact, can extend from 50–200 $\mu$m outside the contact area, laterally and in depth.

In addition to in situ EBIC (and voltage contrast) measurements the electronic effects of the treatments are expressed macroscopically as changes in the shape of the I–V curves. By correlating the changes in I–V characteristics with OBIC/EBIC data, it is possible to adjust in situ the experimental conditions in order to achieve a certain type of doping profile. There are three general types of changes:
  (i) change in resistance observed as change in the slope of a linear I–V curve;
  (ii) change, with time, from an initially linear (ohmic), to a non-linear or diode-like I–V curve;
  (iii) change of shape of originally non-linear or diode-like I–V curve.

The character and intensity of the introduced modifications are dependent on:
  (i) the initial electronic properties of the sample, i.e. resistivity, conductivity type, on its defect chemistry (concentrations of defects) on the quality of the surface and on the presence of structural defects such as dislocations;
  (ii) the type of the contact used (ohmic or Schottky);
  (iii) the applied voltage (polarity, amplitude, frequency and form of a.c. voltage);
  (iv) the sample's temperature.

Figure 2C:
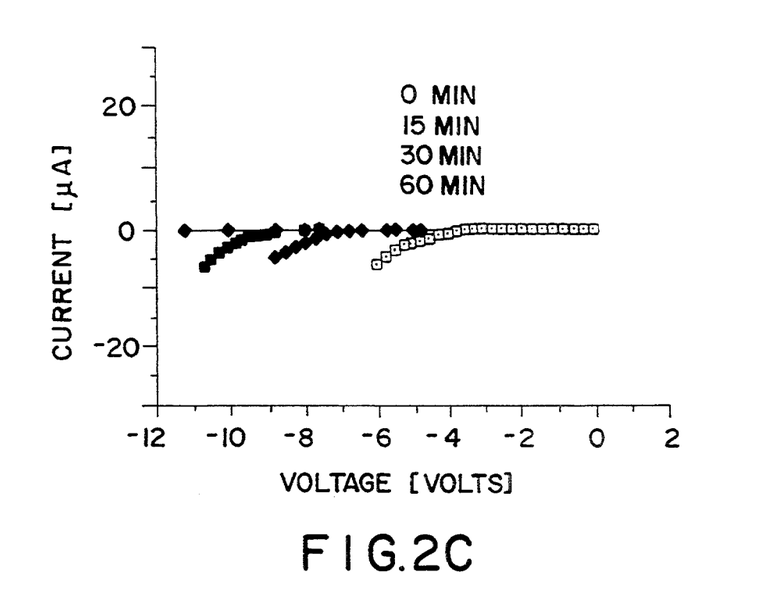

FIG. 2C illustrates the course of a typical experiment, showing I–V curves in reverse direction, measured during the application of bias to a point electrode/n-CuInSe$_2$/large area electrode structure; curve 1 shows the situation at time 0, curves 2,3 and 4 were measured after 15, 30 and 60 minutes, respectively, of process duration. The applied voltages and resulting currents were adjusted during the process so as to avoid decomposition. Their approximative values were several volts, and several tens of $\mu$A', since setting the voltage to the values obtained in curve 4, immediately at the start of the experiment, would lead to decomposition by exceeding the decomposition potential for that (virgin) part of the material and/or by thermal breakdown.

Figure 2D:
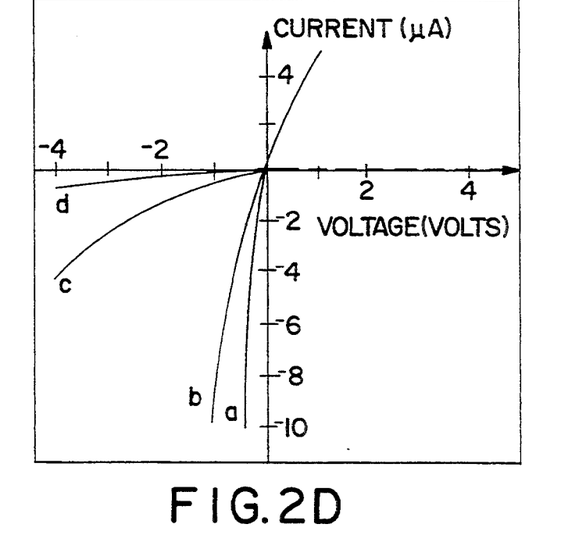

FIG. 2D shows the time evolution of I–V curves, measured during the experiment, in between and after applying the electric fields (in reverse bias, initially) to a p-CuInSe$_2$ crystal, with evaporated Au contact on it. The sample characteristics were Cu: In: Se = 22.6:26.6:50.8 at. %; $1/\sigma_e \approx 4.5 \cdot 10^3$ $\Omega$·cm, carrier mobility $\approx 10$ cm$^2$/V.sec (net acceptor density $\approx 1.5 \cdot 10^{14}$ cm$^{-3}$). The maximum voltages that were applied for the I–V measurements were kept lower ($\leq 4$ V) than the voltages used to create the desired structures. Curves a–d were obtained from applying the conditions as noted. The dashed line shows, schematically, the blocking (reverse bias) parts of curves b,c and d. Positive polarity corresponds to top contact positive with respect to back contact.
  a. Before application of positive bias to the Au contact, showing only a metal-semiconductor I–V characteristic, the high resistance in the forward direction is due to the low (original) carrier concentration of the crystal.
  b. After application of positive bias (36 V, 78 min., 50% duty cycle triangular pulses at 100 Hz) to the Au contact, leading to the formation of a junction outside the area of the Au contact (increase in the forward resistance).
  c. After application of further positive bias (50 V, 98 min., same wave form as in b. above) to the Au contact, showing further increase in the forward resistance. Seebeck coefficient determination showed type conversion.
  d. After further application of positive bias to the Au contact (56 V, 138 min., same wave form as in b. above) leading to the formation of a second junction and to blocking behavior in both polarities.

After situation (d) was reached, application of high electric fields did not change the characteristics until thermal breakdown (>100 V) occurred. Forward bias application leads only to current flow and subsequent heating and thermal breakdown, at any stage prior to, or during the process.

Figure 2E:
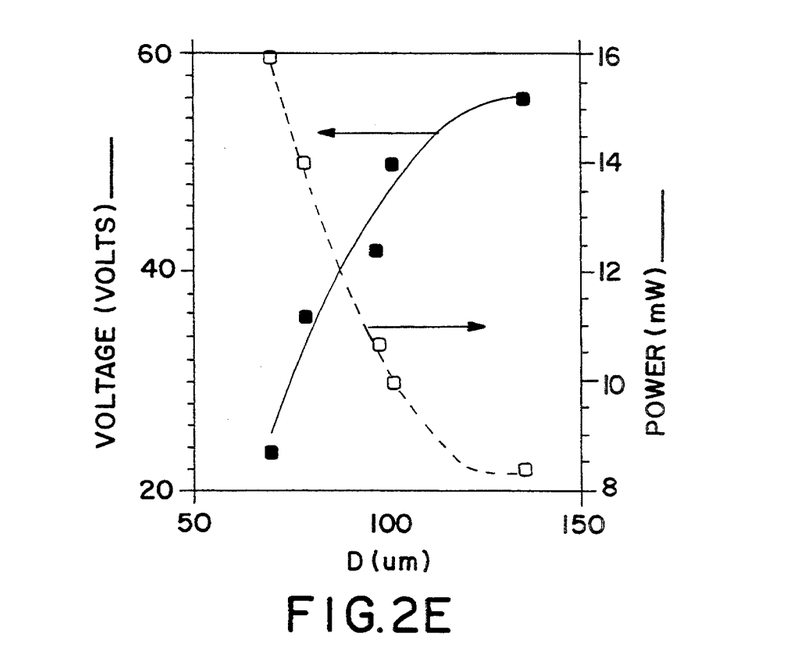

FIG. 2E shows the dependence of the extent of the area that is type-converted (D, in $\mu$m, representing the diameter of the surface area affected) on applied voltage and on the power (current-voltage product), showing the saturation of the effect. As noted above, the final saturation size depends on the original contact size, among other things.

Figure 2F:
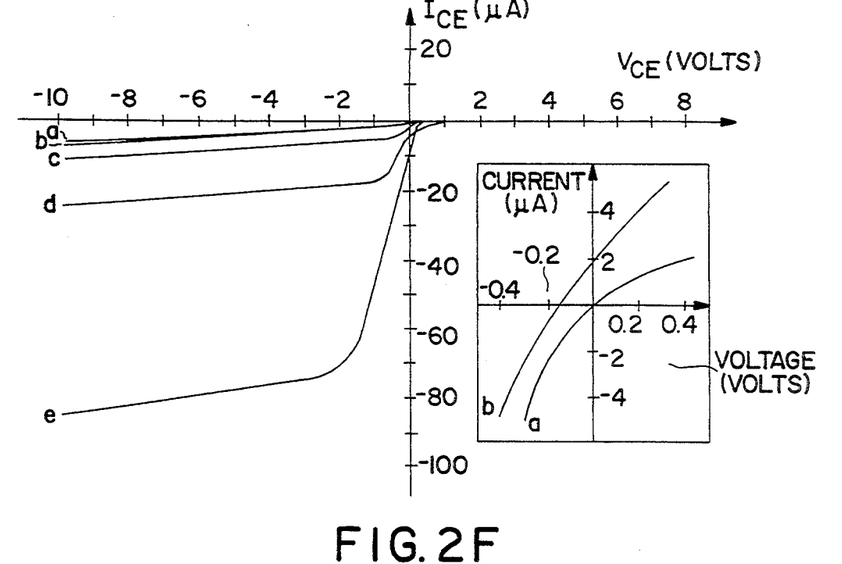

FIG. 2F shows the I–V characteristics obtained with structure corresponding to curve d, FIG. 2D, by exciting the external junction of the structure with the electron beam. The beam current was varied by varying the spot size, from 0 nA (a, dark, i.e. without electron beam excitation) to 0.25 (b, 50 nm) to 0.9 (c, 100 nm) to 3.2 (d, 300 nm) to 16.7 nA (e, 500 nm). The beam currents were measured by way of a Faraday cup. Absorbed currents were, as a rule, 60% of the measured beam currents. Insert: Curve b: same, but for structure corresponding to curve a in FIG. 2D using 500 nm (16.7 nA) electron beam spot size; curve a: without electron beam shown for comparison).

The device response indicates that relatively sharp junctions are formed sufficiently so as to yield amplification of current action.

FIG. 2E shows that the process reaches saturation, corresponding to curve d in FIG. 2D. It can be stopped before saturation when a pre-determined situation in terms of current-voltage characteristic is obtained by applying instead of a simple a-c voltage (H.V. in FIG. 2A), a waveform that contains both high and low voltage regions, with the latter passing through zero, to allow measurement of normal current-voltage characteristics. By repeating such high and low voltage waveform at a sufficiently high frequency and comparing the resulting current-voltage characteristic with the desired one, it is possible to create the desired structure. Such comparison can be done visually, via display of the current-voltage characteristics or by computer. This type of feedback system can be conveniently incorporated in a production system.

An additional possibility for obtaining a device structure with pre-determined properties is to synchronize a photon or particle beam with the low voltage part of the waveform, to follow the evolution of I-V characteristics, such as those shown in FIG. 2F, e.g. phototransistor behavior. In this case it is also possible to intersperse a number of low voltage ramps instead of only one, and to move the photon or particle beam, so as to obtain I-V characteristics for each position of the beam.

An additional mode of process control is the use of OBIC or EBIC inbetween the high voltage applications.

The frequency of applying the high voltage (H.V.) can vary from 1 Hz to several Hz. Preferably, it will be above 25 Hz and below 100 Hz. The high voltage is applied in a unipolar fashion with a duty cycle of 50% or less. The amplitude will be up to 1000 V.

When current increase starts, indicating the beginning of electrical breakdown, the process is stopped to allow current decrease, to the level of reverse saturation current or close to it, so as to avoid thermal breakdown, which would have been induced by continuing the voltage increase, that originally led to the current increase.

Alternatively, current flow limited in time and space, can be induced by exposing the semionic material during the high voltage application (before electrical breakdown, i.e. before appreciable current flow starts) to photon or particle beam pulses. Such pulses will have a duty factor (with respect to the high voltage region) of one percent or less.

Figure 3A:
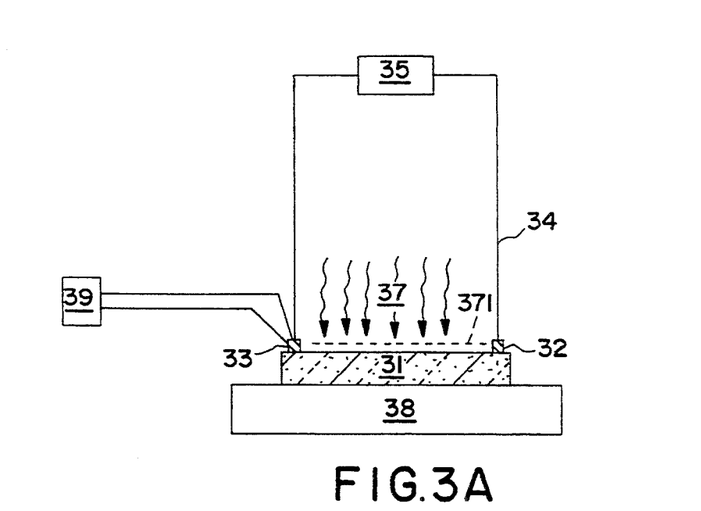
FIG. 3A and 4A are side views, in section, illustrating two possibilities for the simultaneous application of an electric field and an optically created thermal wave and/or photoeffect pattern to a semionic plus the electrical resistivity profile in the semionic that is thus created.
Figure 3B:
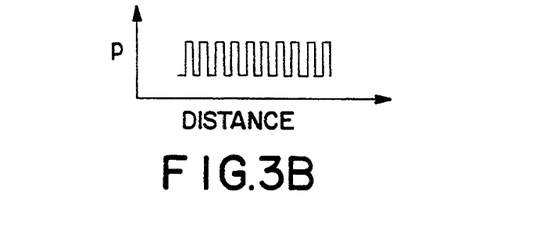

FIG. 3A illustrates a preferred embodiment where a voltage is supplied by source 35 via leads 34 and contacts 32,33 to semiconductor 31, which is mounted on a heat sink 38. 38 can also be cooled actively, e.g. it can be a thermoelectric element. In addition an electromigration field can be applied (37) via mask 371, resulting in a resistivity profile, in 31, as shown in FIG. 3B. This profile can result either from the thermal effects of the optical field, or from photoconductivity, or both. Alternatively or in addition, a thermal field can be applied via contact 33, using current source 39. This field can be a simple profile, when 33 is heated continuously (and/or 38 is cooled continuously) or a more complicated one, when heating and/or cooling varies with time.

Figure 4A:
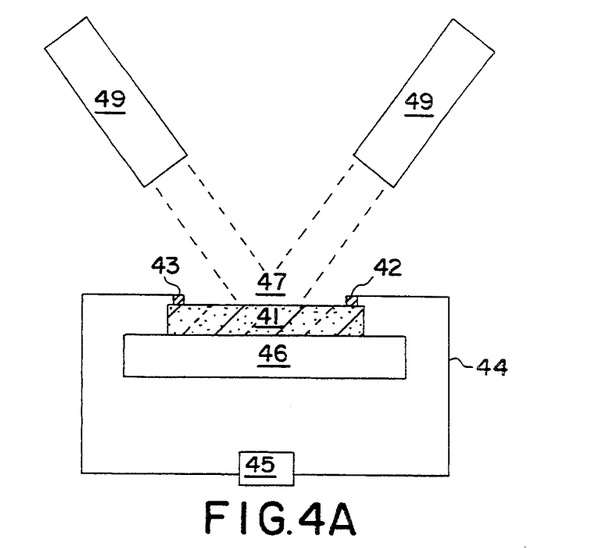

FIG. 4A shows a preferred embodiment where an optical interference pattern 47 is imposed on semiconductor 41, by two optical sources 49, while a voltage is applied from source 45, via leads 44, between contacts 42 and 43, in 41, resulting in a resistivity profile in semiconductor 41. This is shown schematically in FIG. 4B, where the resulting resistivity changes are plotted along the length of semiconductor 41. Alternatively, one of the sources 49 can be a particle beam source, resulting in carrier excitation and/or heating in 41.

Figure 5A:
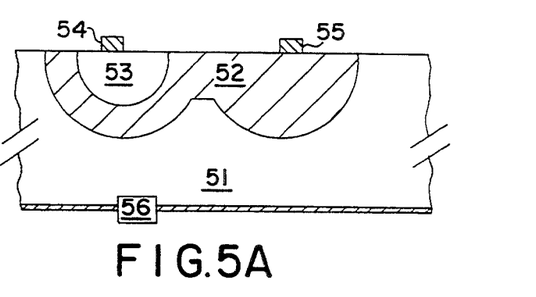
FIGS. 5A and 6 are sectional side views, illustrating the creation of n/p/n structures in a semionic.
Figure 5B:
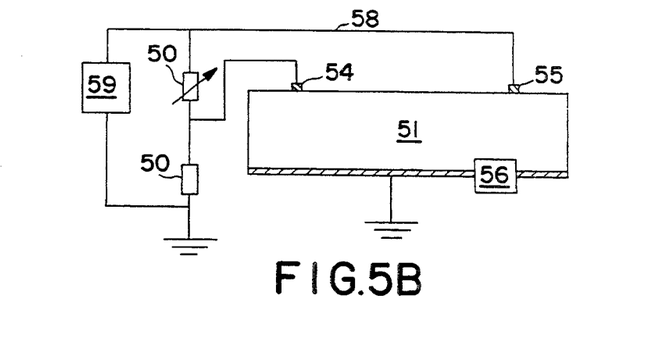
FIG. 5B shows a voltage divider circuit usable to obtain a structure as shown in FIG. 5A.

FIG. 5A illustrates a preferred embodiment where a voltage is applied using source 59, via leads 58 and contacts 54, 55 and 56, to semiconductor 51. If initially both contacts 54 and 55 are used, a region 52 is created with changed electronic properties. If now a suitable voltage divider (50) is used, as shown in FIG. 5B, the voltage between contacts 54 and 55 will create region 53, leaving the junction between 51 and 52 intact and thus leading to a transistor-like structure with 53 as the emitter, 52 as the base and 51 as the collector.

Figure 6:
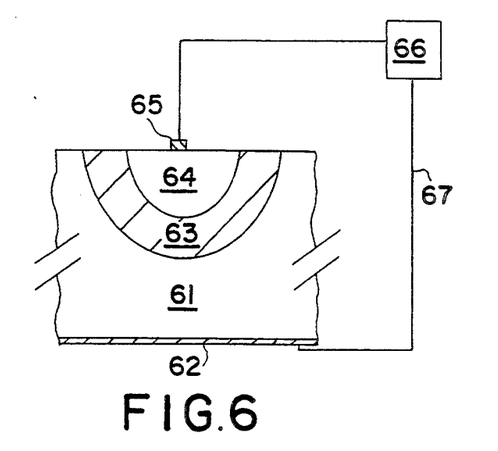

In FIG. 6 a preferred embodiment is shown that is similar to that described in FIG. 5, with 61 being the semiconductor, 62 the large area contact, 65 a point contact, 67 the leads and 64 and 63 being the regions with changed electronic properties.

Figure 7:
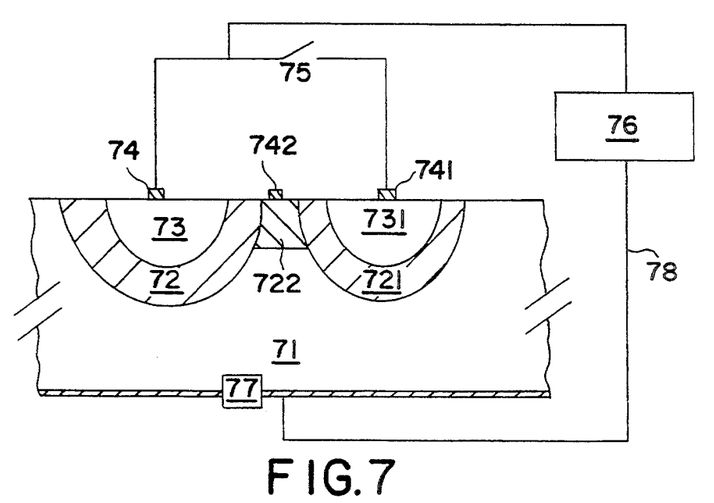
FIG. 7 illustrates the creation of a more complicated structure in a semionic.

In FIG. 7 a preferred embodiment is shown that illustrates a step in the fabrication of more complicated devices. A voltage is applied to 71, via contacts 74 and/or 741, and via contact 77 and leads 78, from source 76. If 71 is n-type, then by controlling switch 75, a multiple /n/p/n/ structure is created formed by regions 71, 72 73, 721 and 731. Contact can be added to create region 722 and so on.

Figure 8:
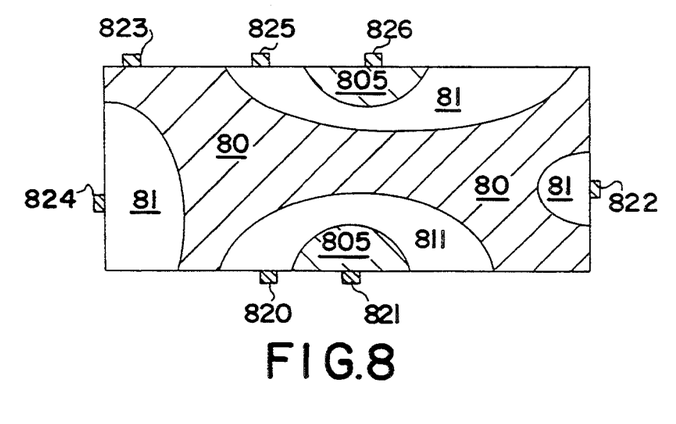
FIG. 8 illustrates a step in the creation of a three dimensional structure in a semionic.

FIG. 8 illustrates a cross-sectional, schematic view of a preferred embodiment that shows a step in the fabrication of a 3-dimensional device, utilizing steps such as those outlined in FIGS. 5 and 7. Electric voltages are applied, according to need, to contacts 821, 822, 824 and 826 to create type-converted regions 81 and re-type-converted regions 805. If needed, region 81 and/or 811, for example, can be made highly resistive, by compensation, via proper choice of the time and magnitude of the potential that is applied between contacts 821 and 823/824/826. It can be contacted using contacts 820 (825 for regions 81). Thus, if the original material 80 was n-type, p/n, n/p/n, n/p/n/p/n and n/p/n/i/n structures can be created in this way.

Figure 9A:
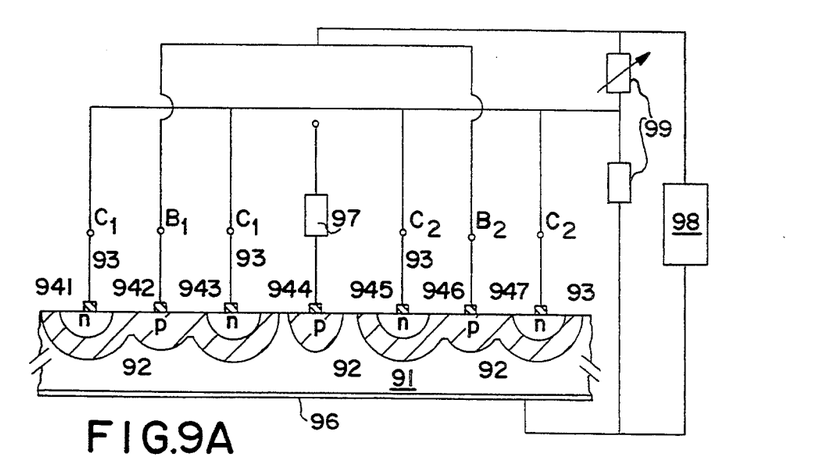
FIGS. 9A and 9B illustrate a step in the creation of an $I^2L$ logic gate structure in a semionic.
Figure 9B:
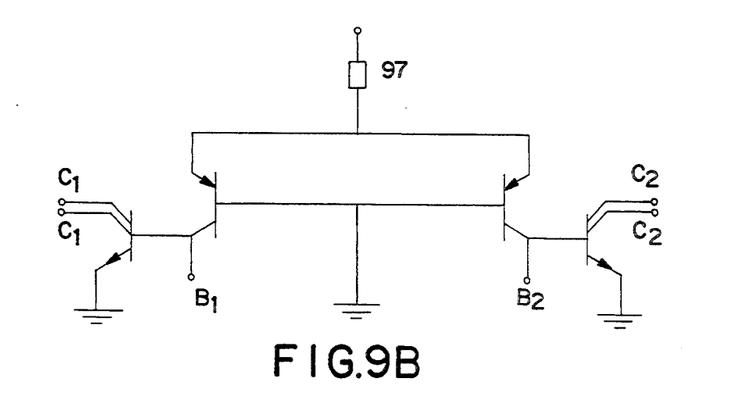
Figure 10:
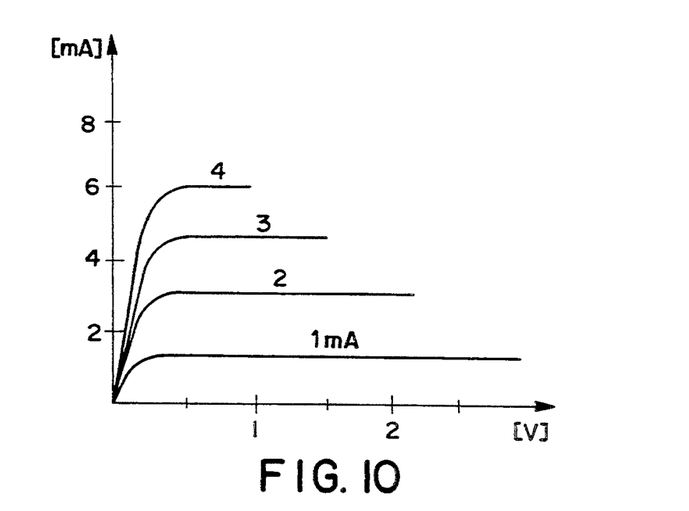
FIG. 10 illustrates the I–V characteristics of a transistor structure created in a semionic, according to FIG. 5.

In FIG. 9A a preferred embodiment is shown that illustrates a step in the fabrication of a logic gate in $I^2L$ technology. Its schematic electronic circuit is shown in FIG. 9B. The active regions were obtained as a combination of the processes explained in Example III and FIG. 5. In FIG. 9A, 941, 942, 943, 944, 945, 946 and 947 are contacts. Of these, 941, 943, 945 and 947 are connected in parallel, and 942, 946 are connected in parallel; 96 is their common back contact; 98 is the power source; 99 are fixed and variable resistors; 97 is a fixed resistor. C1 (C2) are collectors 1 and 2, B1 (B2) are bases 1 and 2. FIG. 10 shows the current-voltage characteristics of the structure shown in FIG. 5A where the voltage is measured between contacts 54 and 56, and the current flows between 54 and 56. The currents shown on the curves (in mA) are those injected between contacts 55 and 54.

EXAMPLE I (FIG. 2)

A p-type crystal of $CuInSe_2$, (21) with area of 5 mm$^2$ and about 1 mm thick, was used as sample. It had a net hole concentration of $6*10^{17}$ cm$^{-3}$, a hole mobility of 5 cm$^2$/V.sec and a room temperature resistivity of 2.1 $\Omega$.cm. A 6 $\mu$m diameter Au point electrode (23) was used as pressure contact on top of the sample. A large Au contact (22) was sputtered onto the back of the crystal. The sample was mounted on a metal stage (24), serving as a heat sink, in a SEM. A DC electric field (25) was applied for 10 hours, yielding 6 V between the Au point and back electrodes. Joule heating provided a thermal gradient (hot point electrode and cold back contact). After this treatment EBIC scans showed the formation of a circular junction (26) at about 200 $\mu$m from the point electrode with a collection efficiency between $10^3$ and $10^4$. The I-V characteristic proved diode behavior between contacts (23) and (22). Similar results were obtained with $CuInSe_2$ and $Cu_3AsSe_4$.

EXAMPLE II (FIG. 6)

An n-type crystal of $CuInSe_2$ (61) (1.1 mm thick) was prepared as in Example I, and a Pt point electrode (65) was used. It had a net donor density of $3*10^{17}$ cm$^{-3}$, a mobility of 70 cm$^2$/V.sec and a resistivity of 0.3 $\Omega$.cm. The Pt/$CuInSe_2$ contact had rectifying properties. Square electric voltage pulses of 6 V at 2.5 Hz and 0.2 duty factor (an AC field) (66) were applied during about 5 min. in reverse direction of this contact (point electrode negative and the back electrode positive). The back side of the sample was kept at 150° K. Joule heating provided a thermal gradient. After this treatment, EBIC scans showed the formation of a n-p-n transistor-like structure in the crystal. Thus emitter/base (64/63) and base/collector (63/61) junctions appeared at 15 and 18 $\mu$m from the point electrode. Similar results were obtained with $Cu_3SbS_3$ and $CuInS_2$.

EXAMPLE III (FIG. 5)

A sample, as in Example II was provided with two gold ohmic contacts (54) of 100 $\mu$m $\times$ 100 $\mu$m on the top surface. Current pulses (2 Hz, 20% filling factor, power per pulse: less than 20 mW) were applied by a source (56) for 24 hours to the back contact (57) and the two top contacts (54), which were kept shorted. After this treatment diode behavior was obtained between each of the top contacts and the back electrode. After this process electric voltage pulses (2 Hz, 20% filling factor or duty cycle, power per pulse: less than 20 mW) were applied for 10 hours using a voltage divider (50) (FIG. 5B). As a result a transistor structure (51/52/53) was obtained, as examined by EBIC. FIG. 10 shows the static I–V curves of this transistor. Similar results were obtained with $Cu_2GeSe_3$ and $CuInS_3$.

EXAMPLE IV

An n-type crystal of $CuInSe_2$ was prepared and treated as in Example III. The treatment was continued for about 10 minutes. EBIC scans after the treatment show the formation of an n-p-n-p structure with junctions at 8, 15 and 18 $\mu$m in the crystal, around the point electrode. Similar results were obtained with $Cu_3AsS_4$ and $CuInS_2$.

EXAMPLE V

An n-type $AgInSe_2$ crystal was prepared as in Example I using Pt contacts at $\leq$6 $\mu$m diameter. The sample had a net donor concentration of $4*10^{13}$ cm$^{-3}$, a mobility of about 200 cm$^2$/V.sec and a resistivity of about 700 $\Omega$.cm. An AC electric field was applied (2 Hz, 0.2 duty cycle) for 10 hours with the point electrode 6 V positive with respect to the back electrode (forward direction of the Pt/$AgInSe_2$ rectifying contact). After this treatment EBIC scans show the formation of a collection region around the point electrode, allowing collection from a hemisphere, with the collection efficiency decreasing to $\frac{1}{3}$ of its peak (center) value at 60 $\mu$m from the center. Similar results were obtained with $CuIn_5S_8$ and $AgIn_5Se_8$.

EXAMPLE VI

An n-type $CuInSe_2$ crystal with net donor density of $3*10^{17}$ cm$^{-3}$, mobility of 20 cm$^2$/V. sec and resistivity of 1 $\Omega$.cm, 1.0 mm thick, was prepared as in Example I. After a treatment identical to that described in Example V, a collection region was created as observed in Example V for $AgInSe_2$. This region extends to 85 $\mu$m from the point electrode. Similar results were obtained with $AgInS_2$ and $AgIn_5S_8$.

EXAMPLE VII (FIG. 3)

A $CuInSe_2$ p-type crystal (31) (the same properties as the sample in Example I) provided with two large area Au ohmic contacts (32 & 33) on the top surface (distance between contacts about 1 mm) was mounted on a thermoelectric cooler (38). A thermocouple was attached to the crystal. The crystal was illuminated with white light (37) through a grid (371) positioned between the contacts. Stabilized current pulses (35) of one sign (100 mA, 20% filling factor, frequency 2 Hz) were used to bias the crystal. The thermoelectric cooler (38) prevented temperature rise of the crystal due to both light illumination and Joule heating. The temperature of the crystal was less than 305° K. (33,39) during the whole experiment. After 48 hours, permanent changes in local resistivity in the near top surface region of the crystal were revealed by EBIC. The changes reflected in their geometrical form the shape of the grid. Similar results were obtained in $CuGaSe_2$ and $CuGe_2P_3$.

EXAMPLE VIII (FIG. 4)

Figure 4B:
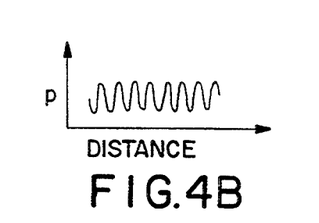

A p-type $CuInSe_2$ crystal (41) with the same properties as in Example I was prepared as in Example VI. This time however, instead of illumination through a grid, two laser beams (49) were used to produce an interference pattern on the top surface of the sample (47). After biasing the sample under the same conditions as in Example VI a stable resistivity pattern in the sample was revealed by EBIC, reflecting in its geometrical form the light interference pattern (FIG. 4B). Similar results were obtained with $CuInTe_2$, $AgSbSe_2$ and $CuSn_2Se_3$.

EXAMPLE IX (FIG. 9)

A sample (91), as in Example II, was provided with seven gold ohmic contacts (100 $\mu$m $\times$ 100 $\mu$m.) (941-947) as shown in FIG. 9. Current pulses as in Example III were applied for 24 hours to the back contact (96) and the seven top contacts which were kept shorted. After this treatment diode behavior was obtained between each of the top contacts and the back electrode (regions 91 and 92). After this process electric voltage pulses, as in Example III were applied for 10 hours using a voltage divider (99). As a result a structure was obtained (regions 91,92,93) that corresponds to the schematic electronic circuit shown in FIG. 9B. 97 represents an added resistor. Similar results were obtained with $CuInS_2$.

EXAMPLE X (Fig. 2)

An n-type crystal of $Hg_{0.3}Cd_{0.7}Te$, with an area of 5 mm$^2$ and 1 mm thick, was used as a sample. It had a net electron concentration n=$1.77\times10^{16}$ cm$^{-3}$, mobility $\mu$=730 cm$^2$/V.sec and resistivity of $\rho$=0.48 $\Omega$.cm at room temperature. The sample was mechanically polished and 50 $\mu$m diameter gold spots, 20 nm thick were evaporated on its surface. Preliminary I–V measurements showed these gold spots to be rectifying Schottky contacts. Reverse bias, with respect to the Schottky contact, was applied in the form of periodical pulses, as in Example VII. The voltage was supplied between the gold spots and the back contact. When the applied voltage increased slowly (from 5 to 20 V during 12 hours) smooth changes are observed in the shape of the I–V curves, indicating improvement of their rectifying properties. EBIC scans taken after this treatment showed that a p-n junction had been created around the gold spot, at about 200 μm from the center of it. Similar results were obtained with samples of (Cd,Zn,Hg)Te and (Hg,Zn)Te.

Although the invention has been described in detail, changes may be made which do not depart from the inventive teachings; such are deemed to fall within the purview of the claimed invention.

We claim:

1. A process for the production of a monolithic electronic single-element structure or multi-element structure from a semionic material, which comprises:
   a) establishing a location in a semionic body;
   b) applying an electric field to said location in said semionic body;
   c) maintaining said semionic body including said location at a temperature sufficiently low to preclude melting or decomposition of the semionic body while said electric field is being applied; and
   d) controlling the electric field as to magnitude and time so that no decomposition and macroscopic melting of the material occurs while creating doping profiles sufficiently sharp to define at least one homojunction and thus create an electronic device element in the semionic material in said location thereof.

2. A process according to claim 1, wherein the structure is the result of application of a predetermined electric field, in combination with application of at least one additional excitation field, resulting in the creation of an electrical resistivity pattern in the semionic material, resulting in the formation of single or multiple electronic device elements throughout the semionic material at locations thereof.

3. A process according to claim 1, wherein the electric field comprises a high voltage component that is applied intermittently.

4. A process according to claim 2, wherein at least one of the additional excitation fields is a thermal field.

5. A process according to claim 4, where the thermal field is the result of Joule heating by an applied external field or a particle beam.

6. A process according to claim 4, where the thermal field is applied by using electromagnetic or particle beam excitation of the semionic material.

7. A process according to claim 2, where at least one of the additional excitation fields is an electromagnetic field or is produced by a particle beam.

8. A process according to claim 1, where the electric field is applied so as to generate native dopants.

9. A process according to claim 1, where the electric field is applied so as to move native dopants.

10. A process according to claim 1, where the semionic material is selected from ternary or multinary chalcogenide and/or pnictide semiconductors.

11. A process according to claim 1, where the semionic is selected from copper and/or silver and/or Cd and/or Zn-containing ternary or multinary chalcogenide and/or pnictide semiconductors.

12. A process according to claim 7 wherein the electric field is comprised of a high voltage segment followed by a low voltage segment.

13. A process according to claim 12 including the further step of exposing the semionic material to a photon or particle beam during the low voltage segment.

14. A process according to claim 1, where the electric field that is applied, varies with time and has maximal amplitudes on the order of about 1 V/cm to about $10^6$ V/cm, below the effective decomposition potential of the semionic material.

15. A process according to claim 10, wherein the semionic material is selected from:

| | |
|---|---|
| I-III-VI$_2$ | e.g. CuInSe$_2$ |
| (IIa,IIb)-VI | e.g. (Cd,Hg)Te |
| I-V-VI$_2$ | e.g. CUSbSe$_2$ |
| II-IV-V$_2$ | e.g. ZnSnAs$_2$ |
| I-III$_5$-VI$_8$ | e.g. AgIn$_5$Se$_8$ |
| I$_3$-V-VI$_4$ | e.g. Cu$_3$AsS$_4$ |
| I$_3$-V-VI$_3$ | e.g. Ag$_3$SbS$_3$ |
| I$_2$-IV-VI$_3$ | e.g. Cu$_2$GeS$_3$ |
| I$_4$-IV$_3$-VI$_5$ | e.g. Cu$_4$Si$_3$S$_5$ |
| I$_8$-IV-VI$_6$ | e.g. Cu$_8$SiS$_6$ and |
| I-IV$_2$-V$_3$ | e.g. CuGe$_2$P$_3$ |
| II-VI:I | e.g. CdS:Cu |
| III-V:II | e.g. GaP:Zn, | the Roman numerals I, III, IV, V and VI representing elements of the respective columns in the periodic table of elements.

16. A process according to claim 14, wherein I=Cu and/or Ag; II=Cd and/or Zn and/or Hg; III=Al, Ga, In and/or Tl, (and/or Fe); IV=Si, Ge and/or Sn; V=P, As and/or Sb (and/or vanadium); VI=S, Se and/or Te.

17. A process according to claim 14, wherein the semionic material is selected from the group consisting of CuInSe$_2$, CuInS$_2$, CuSbSe$_2$, AgIn$_5$Se$_8$, Cu$_3$AsS$_4$, Ag$_3$SbS$_3$, Cu$_4$Si$_3$S$_5$, Cu$_8$SiS$_6$, CuGe$_2$P$_3$, (Cd,Hg)Te and (Cd,Zn)Te.

18. A process according to claim 1 including the further step of cooling the semionic material.

19. A process according to claim 3 wherein the semionic material is exposed to a photon or particle beam during application of the high voltage.

* * * * *